United States Patent
Wang

[19]

[11] Patent Number: 6,043,478
[45] Date of Patent: Mar. 28, 2000

[54] ACTIVE PIXEL SENSOR WITH SHARED READOUT STRUCTURE

[75] Inventor: Yi-Tang Wang, Hsin Chu, Taiwan

[73] Assignee: Industrial Technology Research Institute, Hsinchu, Taiwan

[21] Appl. No.: 09/104,955

[22] Filed: Jun. 25, 1998

[51] Int. Cl.⁷ .................................................. H01J 40/14
[52] U.S. Cl. .................................. 250/208.1; 250/214 R; 348/308
[58] Field of Search ........................ 250/208.1, 214 R, 250/214 LA, 214 LS; 348/308, 307, 302, 294, 298; 257/291, 298, 294, 443–448; 356/218, 222

[56] References Cited

U.S. PATENT DOCUMENTS 5,900,623  5/1999  Tsang et al. ......................... 250/208.1

*Primary Examiner*—Que T. Le
*Attorney, Agent, or Firm*—Harness, Dickey & Pierce, P.L.C.

[57] ABSTRACT

An active pixel sensor with a shared readout structure controls the switching of its transistors in a time-divided manner in conjunction with the appropriate switching of the voltage of a variable voltage source, whereby two pixels in a sensor can share a common readout structure and a selecting transistor commonly used in conventional art is not required. The present invention comprises: a first photodiode and a first NMOS transistor, wherein the anode and cathode of the first photodiode are coupled to a ground and the source of the first NMOS transistor, respectively, and a first selecting signal is coupled to the gate of the first NMOS transistor; a second photodiode and a second NMOS transistor, wherein the anode and cathode of the second photodiode are coupled to the ground and the source of the second NMOS transistor, respectively, and a second selecting signal is coupled to the gate of the second NMOS transistor; and a third NMOS transistor and a fourth NMOS transistor, wherein the drains of the first and second NMOS transistors are coupled to the source of the third NMOS transistor and the gate of the fourth NMOS transistor, and a reset signal is coupled to the gate of the third NMOS transistor, and the drains of the third and fourth NMOS transistors are coupled to a variable voltage source.

3 Claims, 3 Drawing Sheets

ACTIVE PIXEL SENSOR WITH SHARED READOUT STRUCTURE

BACKGROUND OF THE INVENTION

1. Field of the Invention

The present invention relates in general to an active pixel sensor. More specifically, it relates to an active pixel sensor with a shared readout structure.

2. Description of the Related Art

Charge coupled devices are well-known image sensing devices utilized in various applications. In addition to charge coupled devices, active pixel sensors are also applied as image sensors. Active pixel sensors work by using photodiodes in conjunction with NMOS transistors (fabricated by the standard CMOS process) to sense images (light intensity).

FIG. 1 illustrates a circuit diagram of an active pixel sensor. In FIG. 1, the drain and source of a NMOS transistor T1 are coupled to a constant voltage source VB and the cathode of a photodiode Dp, respectively, and the anode of the photodiode Dp is coupled to a ground. The drain and source of a NMOS transistor T2 are coupled to the constant voltage source VB and the drain of a NMOS transistor T3, respectively, and the gate of the NMOS transistor T2 is coupled to the cathode of the photodiode Dp.

The active pixel sensor depicted in FIG. 1 utilizes the photodiode Dp to sense light intensity (images) and transforms it into electric signals, and then the electric signal is outputted from the source of the NMOS transistor T3. The operation of the active pixel sensor is described in detail as follows in reference to the timing chart of FIG. 2. For brevity, the waveforms in FIG. 2 are not plotted in actual voltage amplitudes and time lengths.

In the horizontal blanking interval, the NMOS transistor T3 is turned on by a selecting signal SL. In Co time interval (1), the NMOS transistor T1 is not turned on, and the voltage (VIN) at node A is amplified by the NMOS transistors T2 and T3, thereby obtaining a voltage V1 from terminal read_out (the source of the NMOS transistor T3). In time interval (2), the NMOS transistor T1 is turned on by a reset signal RST, and a light-induced current generated by the photodiode Dp flows from the constant voltage source VB through the NMOS transistor T1 and the photodiode Dp to the ground, thereby charging the voltage at the node A to VIN'. In time interval (3), the NMOS transistor T1 is turned off, and voltage VIN' at node A is amplified by the NMOS transistors T2 and T3, thereby obtaining a voltage V2 from terminal read_out. The difference between the voltages V2 and V1 corresponds the light intensity sensed by the photodiode Dp.

In general, an image-sensing device is implemented by using a plurality of active pixel sensors arranged in a two-dimension array of columns and rows. The IC layout of the image sensing device is schematically depicted in FIG. 3, wherein the regions enclosed by dashed-lines represent the active pixel sensors. For brevity, only a part of the conductive lines are shown in this figure, such as the selecting signal line SL, reset signal line RST, voltage source line VB, and output line read_out. Based on the CMOS process, in every active pixel sensor, the selecting signal line SL and the reset signal line RST are fabricated by polysilicon lines, and the voltage source line VB and output line read_out are fabricated by metal lines. Referring to FIG. 1 and FIG. 3, the voltage source line VB and output line read_out are connected to the drain/source regions (n-type diffusion regions), and the source of the NMOS transistor T1 is connected to the gate (polysilicon gate) of the NMOS transistor T2. Consequently, fabricating an active pixel sensor requires three contact regions, three NMOS transistors, and a photodiode.

In view of the active pixel sensor described, the light intensity sensed by every photodiode is outputted via a readout circuit formed by transistors T1, T2, and T3. In an image sensing device, if two photodiodes disposed at two adjacent active pixel sensors can share the same readout circuit, then the chip (circuit) area required for fabricating the image sensing device and the process complexity can be reduced.

SUMMARY OF THE INVENTION

Therefore, an object of the present invention is to provide an active pixel sensor with a shared readout structure allowing two photodiodes disposed at two adjacent active pixel sensors to share the same readout circuit.

The present invention controls the switching of the transistors in a time-divided manner in conjunction with the appropriate switching of the voltage of a variable voltage source, whereby two pixels in a sensor can share a common readout structure and a selecting transistor commonly used in conventional art is not required.

The present invention achieves the above-indicated objects by providing an active pixel sensor with a shared readout structure which comprises: a first photodiode and a first NMOS transistor, wherein the anode and cathode of the first photodiode are coupled to a ground and the source of the first NMOS transistor, respectively, and a first selecting signal is coupled to the gate of the first NMOS transistor; a second photodiode and a second NMOS transistor, wherein the anode and cathode of the second photodiode are coupled to the ground and the source of the second NMOS transistor, respectively, and a second selecting signal is coupled to the gate of the second NMOS transistor; and a third NMOS transistor and a fourth NMOS transistor, wherein the drains of the first and second NMOS transistors are coupled to the source of the third NMOS transistor and the gate of the fourth NMOS transistor, and a reset signal is coupled to the gate of the third NMOS transistor, and the drains of the third and fourth NMOS transistors are coupled to a variable voltage source.

The variable voltage source mentioned above is switched between a high voltage and a low voltage, and the operation of the active pixel sensor with a shared readout structure is described as follows.

When the variable voltage is switched to the high voltage and the first (or second) NMOS transistor is turned on by the first (or second) signal, a first response voltage in response to a first voltage at the gate of the fourth NMOS transistor is outputted by the fourth transistor.

When the third NMOS transistor is turned on by the third signal, a second response voltage in response to a second voltage at the gate of the fourth NMOS transistor is outputted by the fourth NMOS transistor, and the difference between the first and second response voltages corresponds to the light intensity sensed by the first (or second) photodiode.

When the variable voltage is switched to the low voltage and the first (or second) NMOS transistor is not turned on by the first (or second) signal and the third transistor is turned on by the third signal, the voltage at the gate of the fourth NMOS transistor is reset to the first voltage.

Then above operations are carried out again to read the light intensity sensed by the other photodiode.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENT

Figure 1:
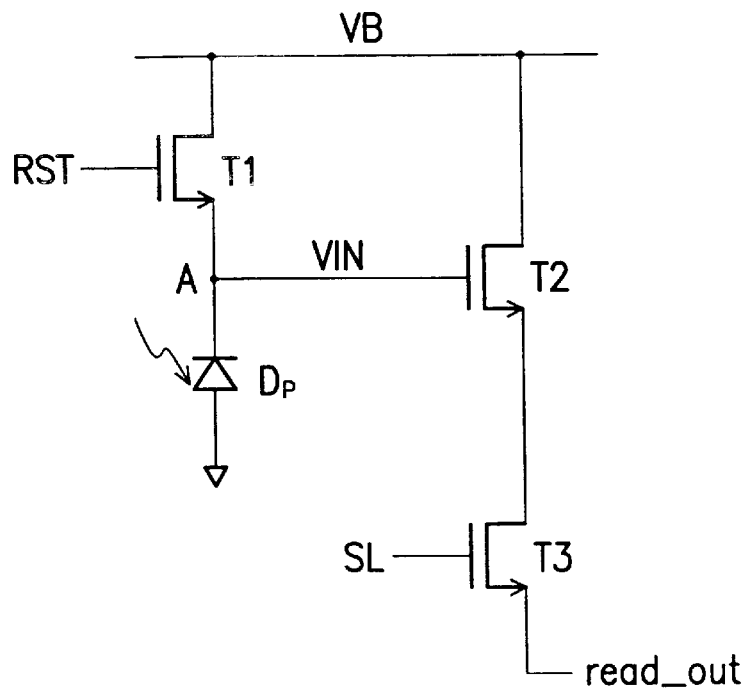
FIG. 1 illustrates a circuit diagram of a conventional active pixel sensor.
Figure 2:
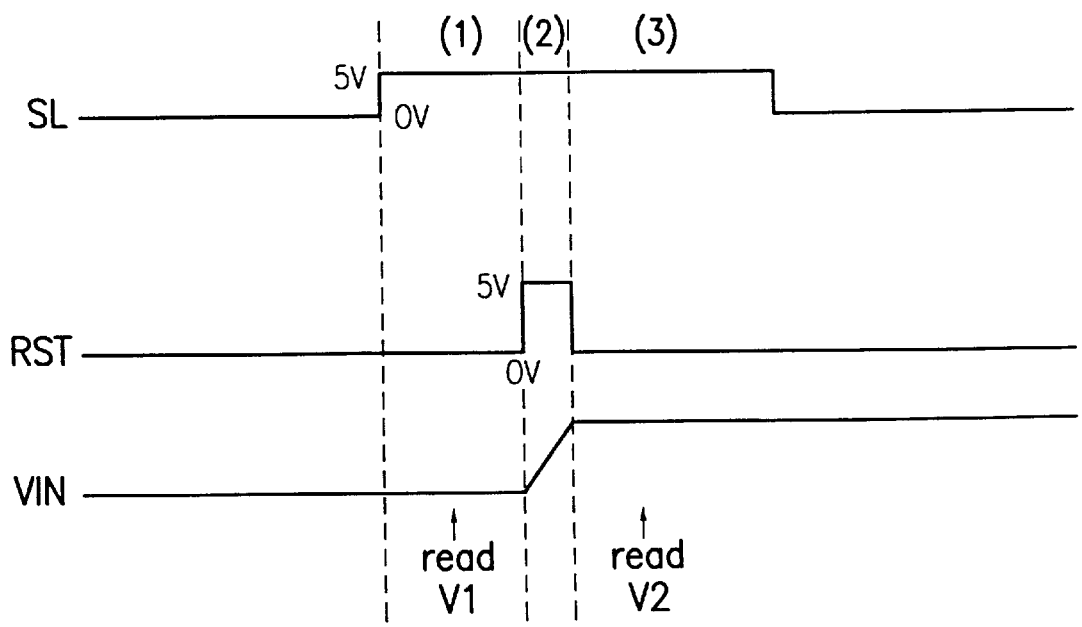
FIG. 2 illustrates the operation timing chart of the circuit depicted in FIG. 1.
Figure 3:
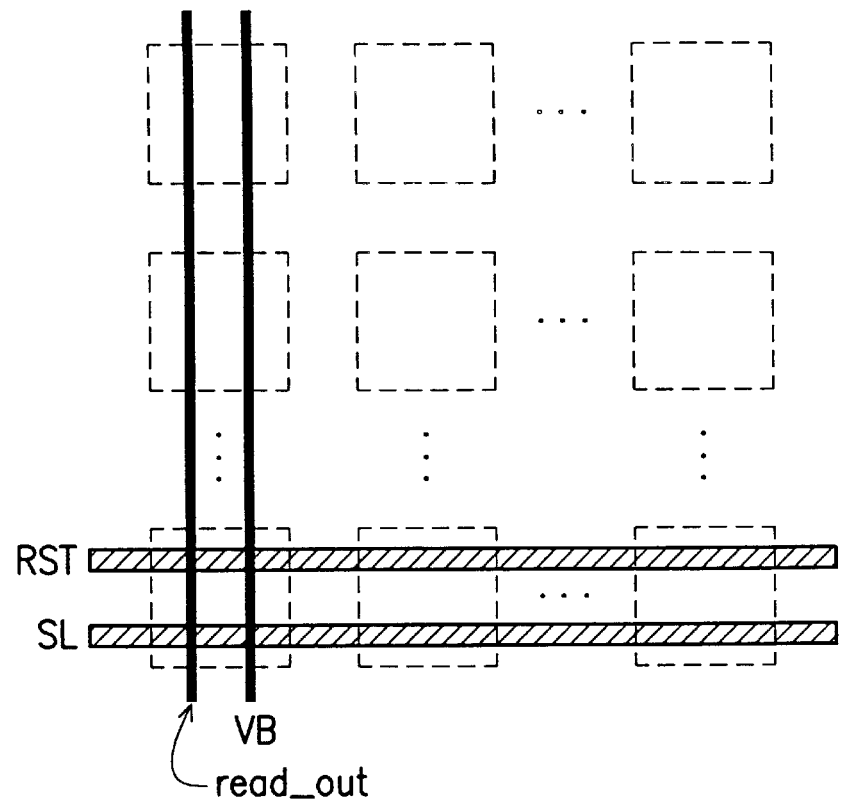
FIG. 3 schematically illustrates the IC layout of an image-sensing device.
Figure 4:
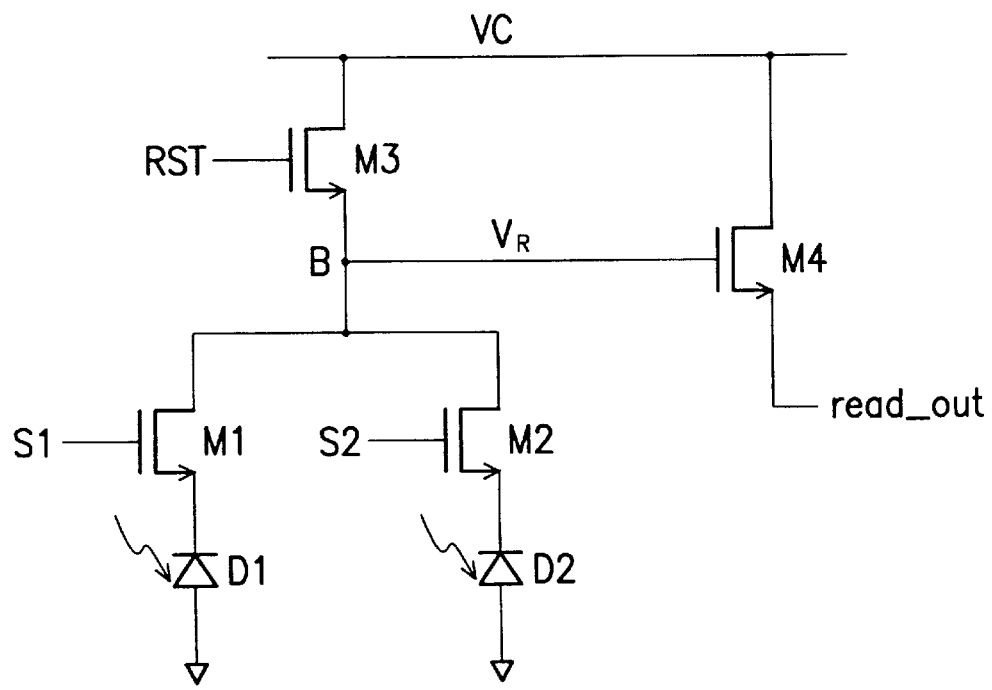
FIG. 4 illustrates a circuit diagram of an active pixel sensor according to the present invention.

Referring to FIG. 4, the circuit connection of an active pixel sensor with a shared readout structure is described as follows.

The anode and cathode of a first photodiode D1 are coupled to a ground and the source of a first NMOS transistor M1, respectively, wherein a first selecting signal S1 is coupled to the gate of the NMOS first transistor M1.

The anode and cathode of a second photodiode D2 are coupled to a ground and the source of a second NMOS transistor M2, respectively, wherein a second selecting signal S2 is coupled to the gate of the second NOMS transistor M2.

The source of a third NMOS transistor M3 is coupled to the drains of the first and second NMOS transistors (M1, M2) and the gate of a fourth NMOS transistor M4. The drains of the third and fourth NMOS transistors (M3, M4) are coupled to a variable voltage source VC, and a reset signal RST is coupled to the gate of the third NMOS transistor M3.

The images (light intensity) sensed by the first and second photodiodes (D1, D2) are outputted from the terminal (read_out) at the source of the fourth NMOS transistor M4 by appropriate switching of the first and second signal (S1, S2) and the reset signal RST in conjunction with the switching of the voltage of the variable voltage source VC. The variable voltage source VC is switched between a high voltage (3 V) and a low voltage (0 V).

Figure 5:
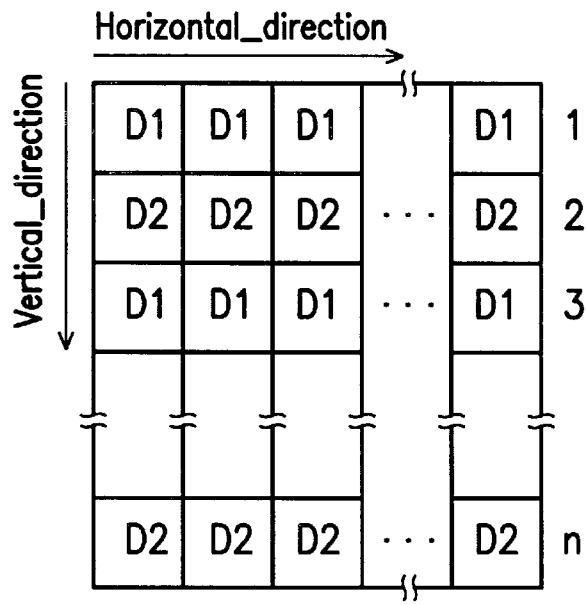
FIG. 5 schematically illustrates an image-sensing device comprising the active pixel sensors according to the present invention.

FIG. 5 schematically illustrates an image sensing device comprising the active pixel sensors according to the present invention, wherein for brevity, only the photodiodes (D1, D2) arranged in a two-dimensional array of rows and columns are depicted. When the image sensing device outputs data, the image data (light intensity) sensed by photodiodes is read out along the horizontal direction, from the first row to the last (n-th) row. Along the vertical direction, the photodiodes (D1, D2) at two adjacent rows are conjoined into a single pixel sensor unit. Therefore, every two adjacent photodiodes (D1, D2) share the same readout structure, under appropriate switching the first and second signal (S1, S2) and the reset signal RST in a time-divided manner in conjunction with switching the voltage of the variable voltage source VC.

Figure 6:
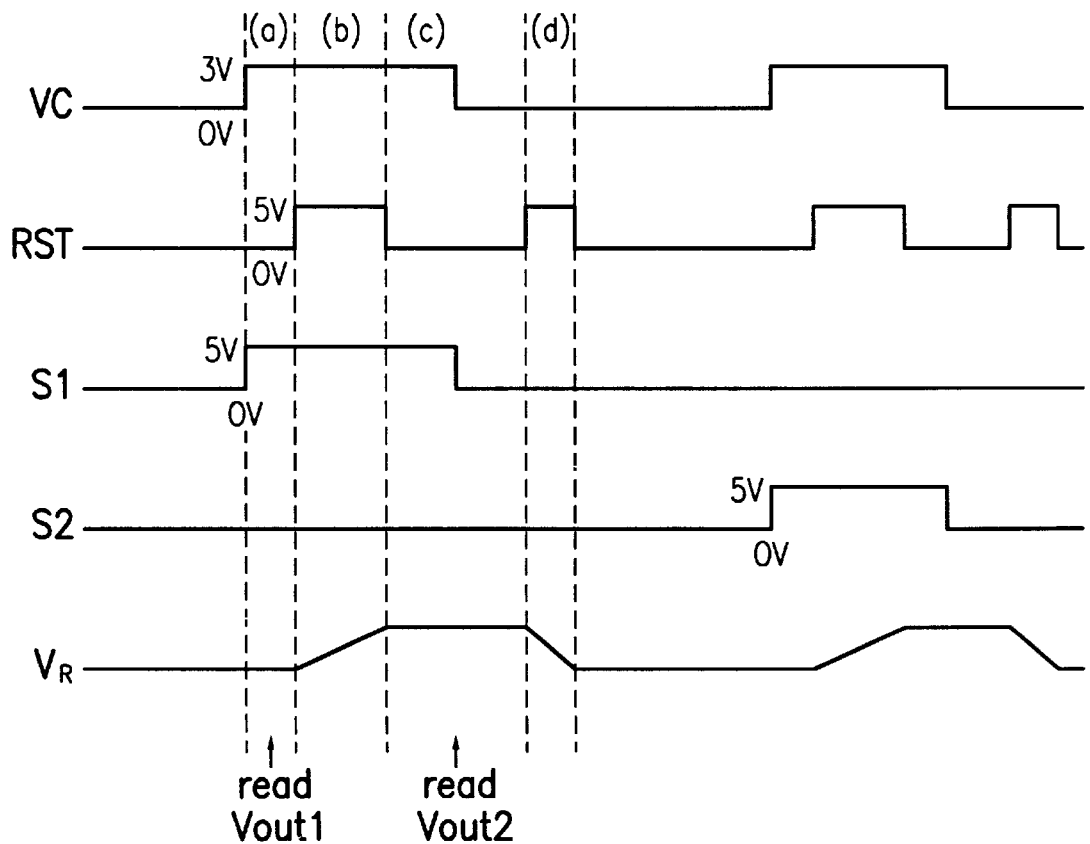
FIG. 6 illustrates the operation timing chart of the circuit depicted in FIG. 4.

The operation of the active pixel sensor with a shared readout structure is described in detail as follows in reference with the timing chart of FIG. 6. For brevity, the waveforms in FIG. 6 are not plotted in actual voltage amplitudes and time lengths.

In time interval (a), the variable voltage is switched to a high voltage (3 V), and the first transistor M1 is turned on by the first selecting signal S1 (5V), and the voltage $V_R$ at node B is outputted from the transistor M4, thereby obtaining a first response voltage Vout1 at terminal read_out.

In time interval (b), the third transistor M3 is turned on by the reset signal RST (5 V), and the light-induced current is generated by the photodiode D1, which flows form the variable voltage source VC through the third and first transistors (M3, M1) and the photodiode D1 to the ground. The variable voltage VC (3 V) charges the voltage $V_R$ at node B.

In time interval (c), the third transistor M3 is turned off by the reset signal RST (0 V), and the variable voltage source stops charging the voltage $V_R$ at node B. The voltage $V_R$ at node B is outputted from the transistor M4, thereby obtaining a second response voltage Vout2 at terminal read_out. The difference between the second response voltage Vout2 and the first response voltage Vout1, that is (Vout2−Vout1), represents the light intensity sensed by the first photodiode D1. Then, the variable voltage source VC is switched to a low voltage (0 V), and the first transistor M1 is turned off by the first selecting signal S1 (0 V).

In time interval (d), the third transistor M3 is turned on by the reset signal RST (5 V) so that the voltage $V_R$ at node B is discharged to the voltage level of the variable voltage source VC (0 V), thereby resetting the voltage $V_R$ at node B and completing the reading operation to the photodiode D1.

Similarly, the light intensity sensed by the other photodiode (the second photodiode D2) is read out by carrying out the above operation in the case of replacing the first transistor M1 and first selecting signal S1 with the second transistor M2 and the second selecting signal S2, respectively.

The first and second selecting signals are not switched to 5 V at the same time so that the first and second transistors will not be turned on at the same time.

In view of the above descriptions, to fabricate an active pixel sensor with two sensing pixels requires four NMOS transistors, three contact regions, and two photodiodes. To fabricate a conventional active pixel sensor with a single sensing pixel requires three NMOS transistors, three contact regions, and one photodiode.

Therefore, when fabricating an image sensing device with 640×480 pixel resolutions, 640×480×3 NMOS transistors, 640×480×3 contact regions, and 640×480 photodiodes are required by using the conventional active pixel sensor. However, when fabricating an image sensing device with 640×480 pixel resolutions by using the active pixel sensor with a shared structure, only 640×480×2 NMOS transistors, 640×480×1.5 contact regions, and 640×480 photodiodes are required. It is obvious that fabricating an image sensing device with by using the present invention can significantly reduce the required number of NMOS transistors and contact regions. Consequently, the chip area needed for fabricating the IC is reduced, and the throughput is enhanced. Moreover, the reliability of operation is also improved, because of the simplified circuit structure and control.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An active pixel sensor with a shared readout structure comprising:

a first photodiode and a first NMOS transistor, wherein the anode and cathode of said first photodiode are coupled to a ground and the source of said first NMOS transistor, respectively, and a first selecting signal is coupled to the gate of said first NMOS transistor;

a second photodiode and a second NMOS transistor, wherein the anode and cathode of said second photodiode are coupled to said ground and the source of said second NMOS transistor, respectively, and a second selecting signal is coupled to the gate of said second NMOS transistor; and a third NMOS transistor and a fourth NMOS transistor, wherein the drains of said first and second NMOS transistors are coupled to the source of said third NMOS transistor and the gate of said fourth NMOS transistor, and a reset signal is coupled to the gate of said third NMOS transistor, and the drains of said third and fourth NMOS transistors are coupled to a variable voltage source.

2. The sensor as claimed in claim 1, wherein said variable voltage source is switched between a high voltage and a low voltage, and when said variable voltage is switched to said high voltage and said first (or second) NMOS transistors is turned on by said first (or second) signal, a first response voltage in response to a first voltage at the gate of said fourth NMOS transistor is outputted by said fourth transistor;

when said third NMOS transistor is turned on by said third signal, a second response voltage in response to a second voltage at the gate of said fourth NMOS transistor is outputted by said fourth NMOS transistor, and the difference between said first and second response voltages corresponds to the light intensity sensed by said first (or second) photodiode;

when said variable voltage is switched to said low voltage and said first (or second) NMOS transistor is not turned on by said first (or second) signal and said third transistor is turned on by said third signal, the voltage at the gate of said fourth NMOS transistor is reset to said first voltage.

3. The sensor as claimed in claim 2, wherein said first and second NMOS transistors are not turned on at the same time.

* * * * *